(12) United States Patent
Schripsema et al.

(10) Patent No.: US 7,557,290 B2
(45) Date of Patent: Jul. 7, 2009

(54) PHOTOVOLTAIC MODULE WITH ADJUSTABLE HEAT SINK AND METHOD OF FABRICATION

(76) Inventors: Jason E. Schripsema, 3677 18th St., Apartment A, San Francisco, CA (US) 94110; William M. Janvrin, 6081 William Penn Ct., Easton, PA (US) 18045

(*) Notice: Subject to any disclaimer, the term of this patent is extended or adjusted under 35 U.S.C. 154(b) by 810 days.

(21) Appl. No.: 10/514,545

(22) PCT Filed: May 16, 2003

(86) PCT No.: PCT/US03/15888

§ 371 (c)(1),
(2), (4) Date: Nov. 12, 2004

(87) PCT Pub. No.: WO03/098705

PCT Pub. Date: Nov. 27, 2003

(65) Prior Publication Data

US 2006/0137733 A1     Jun. 29, 2006

Related U.S. Application Data

(60) Provisional application No. 60/381,190, filed on May 17, 2002.

(51) Int. Cl.
*H01L 31/052* (2006.01)
(52) U.S. Cl. .................................... 136/243
(58) Field of Classification Search ............... 165/46; 136/243, 253
See application file for complete search history.

(56) References Cited

U.S. PATENT DOCUMENTS 3,350,234 A    10/1967   Ule (Continued)

FOREIGN PATENT DOCUMENTS

JP            10 321 890       12/1998

(Continued)

OTHER PUBLICATIONS

3M Acrylate Overlaminating Film, 7735FL, Technical Data, May 2002 (3 pages).

(Continued)

*Primary Examiner*—Alexa D Neckel
*Assistant Examiner*—Alexander S Tumminelli
(74) *Attorney, Agent, or Firm*—Niels Haun; Dann, Dorfman, Herrell & Skillman, PC

(57) ABSTRACT

The present invention provides a photovoltaic module (20) comprising a photovoltaic material and a heat sink in thermal communication with the photovoltaic material proximate a mounting surface of the heat sink. The heat sink comprises a plurality of fins (12) that are movable between a first position parallel to the mounting surface and a second position non-parallel to the mounting surface. Orientation of the fins in the first position may be particularly desirable during fabrication of the module when the heat sink is attached to the photovoltaic material. As such, the present invention provides a method for fabricating a photovoltaic module comprising providing a photovoltaic material and providing the heat sink having movable fins. The fins are oriented in the first position and the heat sink is then attached to the photovoltaic material. After the heat sink is attached, the fins may be unfolded into the second position.

21 Claims, 2 Drawing Sheets

U.S. PATENT DOCUMENTS

| | | |
|---|---|---|
| 3,766,439 A | 10/1973 | Isaacson |
| 3,833,425 A | 9/1974 | Leinkram et al. |
| 3,957,109 A | 5/1976 | Worthington |
| 3,980,071 A | 9/1976 | Barber, Jr. |
| 3,989,541 A | 11/1976 | Brandhorst, Jr. |
| 3,990,914 A | 11/1976 | Weinstein et al. |
| 3,991,937 A | 11/1976 | Heilemann |
| 3,994,276 A | 11/1976 | Pulver |
| 3,999,283 A | 12/1976 | Dean et al. |
| 4,000,851 A | 1/1977 | Heilemann |
| 4,003,756 A | 1/1977 | Abrams |
| 4,037,583 A | 7/1977 | Bakun et al. |
| 4,040,867 A | 8/1977 | Forestieri et al. |
| 4,052,228 A | 10/1977 | Russell |
| 4,056,405 A | 11/1977 | Varadi |
| 4,067,764 A | 1/1978 | Walker et al. |
| 4,068,652 A | 1/1978 | Worthington |
| 4,081,290 A | 3/1978 | Bachmann et al. |
| 4,082,569 A | 4/1978 | Evans, Jr. |
| 4,095,997 A | 6/1978 | Griffiths |
| 4,106,952 A | 8/1978 | Kravitz |
| 4,114,593 A | 9/1978 | Guertin |
| 4,118,249 A | 10/1978 | Graven et al. |
| 4,122,214 A | 10/1978 | Evans, Jr. |
| 4,123,003 A | 10/1978 | Winston |
| 4,131,485 A | 12/1978 | Meinel et al. |
| 4,134,387 A | 1/1979 | Tornstrom |
| 4,135,290 A | 1/1979 | Evans, Jr. |
| 4,149,903 A | 4/1979 | Lindmayer |
| 4,153,474 A | 5/1979 | Rex |
| 4,169,738 A | 10/1979 | Luque |
| 4,180,056 A | 12/1979 | Schnabel et al. |
| 4,180,414 A | 12/1979 | Diamond et al. |
| 4,184,903 A | 1/1980 | Lovelace et al. |
| 4,193,081 A | 3/1980 | Kaplow et al. |
| 4,200,472 A | 4/1980 | Chappell et al. |
| 4,209,346 A | 6/1980 | King |
| 4,209,347 A | 6/1980 | Klein |
| 4,210,121 A | 7/1980 | Stark |
| 4,211,581 A | 7/1980 | Vasilinina et al. |
| 4,217,633 A | 8/1980 | Evans, Jr. |
| 4,248,643 A | 2/1981 | Peters |
| 4,258,701 A | 3/1981 | Buckley |
| 4,269,170 A | 5/1981 | Guerra |
| 4,278,829 A | 7/1981 | Powell |
| 4,280,853 A | 7/1981 | Palazzetti et al. |
| 4,312,709 A | 1/1982 | Stark et al. |
| 4,320,246 A | 3/1982 | Russell |
| 4,332,973 A | 6/1982 | Sater |
| 4,337,758 A | 7/1982 | Meinel et al. |
| 4,339,626 A | 7/1982 | Fisher et al. |
| 4,339,627 A | 7/1982 | Arnould |
| 4,350,200 A | 9/1982 | McElwain |
| 4,361,717 A | 11/1982 | Gilmore et al. |
| 4,367,367 A | 1/1983 | Reisfeld et al. |
| 4,369,629 A | 1/1983 | Lockwood |
| 4,377,156 A | 3/1983 | Schelzig |
| 4,388,481 A | 6/1983 | Uroshevich |
| 4,392,007 A | 7/1983 | Barkats et al. |
| 4,397,303 A | 8/1983 | Stultz |
| 4,401,839 A | 8/1983 | Pyle |
| 4,411,490 A | 10/1983 | Daniel |
| 4,413,157 A | 11/1983 | Ames |
| 4,415,759 A | 11/1983 | Copeland et al. |
| 4,444,177 A | 4/1984 | Kirchmayer |
| 4,473,066 A | 9/1984 | Clark |
| 4,491,681 A | 1/1985 | Kirpich |
| 4,499,658 A * | 2/1985 | Lewis .................. 438/64 |
| 4,519,384 A | 5/1985 | Murtha |
| 4,521,276 A | 6/1985 | Tsumura et al. |
| 4,527,545 A | 7/1985 | Bertels |
| 4,529,830 A | 7/1985 | Daniel |
| 4,535,335 A | 8/1985 | Tagami et al. |
| 4,545,364 A | 10/1985 | Maloney |
| 4,577,471 A | 3/1986 | Meckler |
| 4,658,086 A | 4/1987 | McLeod et al. |
| 4,658,599 A | 4/1987 | Kajiwara |
| 4,677,248 A | 6/1987 | Lacey |
| 4,683,348 A | 7/1987 | Pidgeon et al. |
| 4,709,466 A | 12/1987 | McCandless et al. |
| 4,716,258 A | 12/1987 | Murtha |
| 4,759,735 A | 7/1988 | Pagnol et al. |
| 4,771,763 A | 9/1988 | Wetzel, Jr. |
| 4,778,478 A | 10/1988 | Barnett |
| 4,806,855 A | 2/1989 | Davis |
| 4,830,677 A | 5/1989 | Geisler, Jr. |
| 4,830,678 A | 5/1989 | Todorof et al. |
| 4,947,825 A | 8/1990 | Moriarty |
| 4,949,704 A | 8/1990 | Pfluger |
| 4,964,713 A | 10/1990 | Goetzberger |
| 4,970,579 A | 11/1990 | Arldt et al. |
| 4,971,633 A * | 11/1990 | Beavis et al. ............. 136/246 |
| 5,073,698 A | 12/1991 | Stultz |
| 5,096,505 A | 3/1992 | Fraas et al. |
| 5,118,361 A | 6/1992 | Fraas et al. |
| 5,123,247 A | 6/1992 | Nelson |
| 5,124,557 A | 6/1992 | Aitken |
| 5,125,983 A | 6/1992 | Cummings |
| 5,164,020 A | 11/1992 | Wagner et al. |
| 5,167,218 A | 12/1992 | Deakin |
| 5,167,724 A | 12/1992 | Chiang |
| 5,177,977 A | 1/1993 | Larsen |
| 5,180,441 A | 1/1993 | Cornwall et al. |
| 5,197,291 A | 3/1993 | Levinson |
| 5,217,539 A | 6/1993 | Fraas et al. |
| 5,232,518 A | 8/1993 | Nath et al. |
| 5,255,666 A | 10/1993 | Curchod |
| 5,312,521 A | 5/1994 | Fraas et al. |
| 5,342,452 A | 8/1994 | Saito et al. |
| 5,459,787 A | 10/1995 | Tomasini et al. |
| 5,460,659 A | 10/1995 | Krut |
| 5,466,301 A | 11/1995 | Hammerbacher et al. |
| 5,498,297 A | 3/1996 | O'Neill et al. |
| 5,505,788 A | 4/1996 | Dinwoodie |
| 5,526,626 A | 6/1996 | Loucks |
| 5,551,991 A | 9/1996 | Avero |
| 5,552,960 A | 9/1996 | Nelson et al. |
| 5,562,406 A | 10/1996 | Ooka et al. |
| 5,569,332 A | 10/1996 | Glatfelter et al. |
| 5,578,142 A | 11/1996 | Hattori et al. |
| 5,601,236 A | 2/1997 | Wold |
| 5,614,033 A | 3/1997 | Robinson et al. |
| 5,616,186 A | 4/1997 | Fraas et al. |
| 5,647,915 A | 7/1997 | Zukerman |
| 5,653,407 A | 8/1997 | Bertheux et al. |
| 5,660,644 A | 8/1997 | Clemens |
| 5,704,992 A | 1/1998 | Willeke et al. |
| 5,758,418 A | 6/1998 | Chrysler et al. |
| 5,771,966 A | 6/1998 | Jacoby |
| 5,787,653 A | 8/1998 | Sakai et al. |
| 5,829,212 A | 11/1998 | McKeag et al. |
| 5,829,512 A * | 11/1998 | August .................. 165/46 |
| 5,865,906 A | 2/1999 | Ferguson et al. |
| 5,897,715 A | 4/1999 | Ward et al. |
| 5,915,466 A | 6/1999 | Aakalu et al. |
| 5,959,787 A | 9/1999 | Fairbanks |
| 6,005,184 A | 12/1999 | Barnes |
| 6,018,123 A | 1/2000 | Takada et al. |
| 6,020,554 A | 2/2000 | Kaminar et al. |
| 6,026,895 A | 2/2000 | Moresco et al. |
| 6,034,319 A | 3/2000 | Falbel |
| 6,038,156 A | 3/2000 | Inam et al. |
| 6,061,977 A | 5/2000 | Toyama et al. |
| 6,062,299 A | 5/2000 | Choo et al. |

| | | |
|---|---|---|
| 6,063,996 A | 5/2000 | Takada et al. |
| 6,080,927 A | 6/2000 | Johnson |
| 6,091,020 A | 7/2000 | Fairbanks et al. |
| 6,111,189 A | 8/2000 | Garvison et al. |
| 6,113,718 A | 9/2000 | Yamada et al. |
| 6,127,622 A | 10/2000 | Yamada et al. |
| 6,176,304 B1 | 1/2001 | Lee |
| 6,176,596 B1 | 1/2001 | Shukla et al. |
| 6,195,874 B1 | 3/2001 | Chen et al. |
| 6,199,624 B1 * | 3/2001 | Wotring ............... 165/80.3 |
| 6,223,813 B1 | 5/2001 | Chrysler et al. |
| 6,223,814 B1 * | 5/2001 | Moresco et al. ........... 165/185 |
| 6,230,788 B1 * | 5/2001 | Choo et al. ............... 165/46 |
| 6,245,987 B1 | 6/2001 | Shiomi et al. |
| 6,252,155 B1 | 6/2001 | Ortabasi |
| 6,257,302 B1 | 7/2001 | Bednarczyk et al. |
| 6,260,610 B1 | 7/2001 | Biber et al. |
| 6,262,481 B1 | 7/2001 | Wang |
| 6,294,729 B1 | 9/2001 | Kaplo |
| 6,321,451 B1 | 11/2001 | Lee et al. |
| 6,321,584 B1 | 11/2001 | Chen et al. |
| 6,337,437 B1 | 1/2002 | Fraas et al. |
| 6,437,982 B1 | 8/2002 | Cardenas |
| 2001/0050161 A1 | 12/2001 | Chrysler et al. |
| 2002/0007936 A1 | 1/2002 | Woerner et al. |
| 2002/0007942 A1 | 1/2002 | Ohta |

FOREIGN PATENT DOCUMENTS

WO    WO 2004/114419    12/2004

OTHER PUBLICATIONS

Macrolux, 8mm Twin Wall Polycarbonate Sheets, CO-EX Corporation, (2 pages), Oct. 2005.

* cited by examiner

PHOTOVOLTAIC MODULE WITH ADJUSTABLE HEAT SINK AND METHOD OF FABRICATION

RELATED APPLICATIONS

This application is a National Stage of International Application No. PCT/US03/15888, filed May 16, 2003, which claims the benefit of priority of U.S. Provisional Application 60/381,190, filed on May 17, 2002, the entire contents of which application(s) are incorporated herein by reference.

FIELD OF THE INVENTION

The present invention relates generally to a photovoltaic device, and in particular but not exclusively a photovoltaic module having an adjustable heat sink and method for the fabrication of such a module.

BACKGROUND OF THE INVENTION

Photovoltaic modules currently enjoy broad commercial use. For example, in terrestrial applications, photovoltaic modules are typically used to power remote electronic equipment such as radio towers, microwave repeater stations, and navigation buoys. Photovoltaic modules are also used to generate power for on-grid applications. In certain applications, photovoltaic modules, such as individual photovoltaic cells, may be wired together to form an array so that increased power may be produced. However, a need exists for photovoltaic modules that provide increased power at greater efficiency than currently available.

One source of inefficiency, and decreased power output, is a decrease in performance of photovoltaic modules at elevated temperatures. It is known that the operating voltage, and therefore power output, of photovoltaic materials decreases as the temperature of the material increases. The effect is approximately linearly proportional to the inverse of the material's change in temperature. It is also known that photovoltaic modules typically operate between 20-30 degrees Celsius higher than the ambient air temperature. This increase in temperature above ambient produces a 5-20% reduction in operating power, depending on the particular photovoltaic cells or materials used in the module.

This reduction in operating power with increased temperature affects many different configurations of photovoltaic modules, such as concentrating photovoltaic collectors and flat-plate modules. Concentrating collector modules use reflective or refractive materials to focus sunlight onto a smaller surface area of photovoltaic cells or materials. Flat plate modules are the most commonly used photovoltaic modules and are typically manufactured as flat assemblies of solar cells encapsulated between glass and suitable rear surface. Both types of modules suffer from reduced power output at elevated temperature. Hence, a need exists for a passive cooling system for photovoltaic modules which may be fabricated in a cost-effective manner.

SUMMARY

The present invention provides a photovoltaic module comprising a photovoltaic material and a heat sink in thermal communication with the photovoltaic material proximate a mounting surface of the heat sink. The photovoltaic material may be provided as a photovoltaic cell. The heat sink comprises a plurality of fins that are movable between a first position substantially parallel to the mounting surface of the heat sink and a second position non-parallel to the mounting surface of the heat sink. Orientation of the fins in the first parallel (or flattened) position may be particularly desirable during fabrication of the module, when the heat sink is attached to the photovoltaic material to facilitate, for example, lamination of the heat sink to the photovoltaic material.

The heat sink may comprise a sheet of thermally conductive polymer or a metal foil, and the fins may be formed from folded portions of the polymer or metal foil. Desirably, the photovoltaic module may comprise an electrically insulating material disposed between the heat sink and the photovoltaic material to deter electrical communication between the heat sink and photovoltaic material. Additionally or alternatively, the photovoltaic module may include an encapsulating material disposed between the heat sink and the photovoltaic material. Optionally, the photovoltaic module may include a lid disposed over the photovoltaic material.

In addition the present invention provides a method for fabricating a photovoltaic module comprising the steps of providing a photovoltaic material and providing a heat sink having a mounting surface and having a plurality of fins that are movable between a first position substantially parallel to the mounting surface and a second position substantially non-parallel to the mounting surface. The method also includes the steps of orienting the fins substantially parallel to the mounting surface and attaching the heat sink to the photovoltaic material. After the heat sink is attached to the photovoltaic material the method may also include the step of orienting the fins in the second position. In one embodiment of the method, the step of attaching the heat sink may comprise laminating. The step of attaching the heat sink may include providing an electrically insulating material between the mounting surface of the heat sink and the photovoltaic material and then bonding the heat sink, electrically insulating material, and photovoltaic material together, such as by lamination.

BRIEF DESCRIPTION OF THE DRAWINGS

The foregoing summary and the following detailed description of the preferred embodiments of the present invention will be best understood when read in conjunction with the appended drawings, in which.

DETAILED DESCRIPTION OF THE INVENTION

Figure 1:
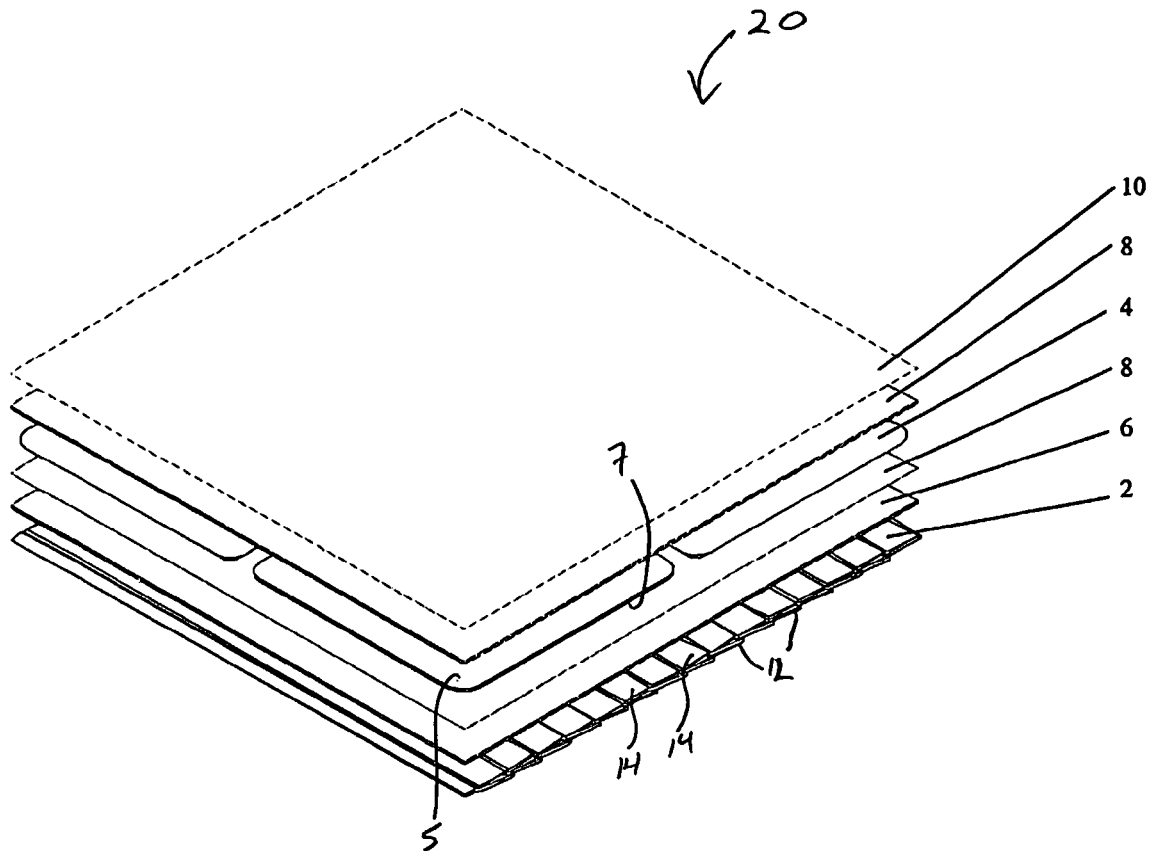
FIG. 1 is an exploded, perspective view of an unframed photovoltaic module having a heat sink with fins disposed in a first, collapsed position which is suited for processing in accordance with the method of the present invention.

Referring now to the drawings wherein like reference numerals refer to the same or similar elements across the several views, and in particular to FIG. 1, there is shown an exploded view of a photovoltaic module 20 in accordance with the present invention. The photovoltaic module 20 comprises a photovoltaic material, which may conveniently be provided in the form of one or more discrete photovoltaic cells 4 or thin film photovoltaic materials. The photovoltaic cells 4 are generally planar in shape, and may conveniently have a rectangular shape. However, other shapes, including non-planar shapes, may be used in accordance with the present invention.

The photovoltaic cells 4 may comprise semiconductor materials in which electron-hole pairs are created when exposed to light to provide an electrical current flow when the photovoltaic module 20 is connected to an electrical circuit. The photovoltaic cells 4 may be manufactured from crystalline silicon, amorphous silicon, copper-indium-disellinide, cadmium-telluride, gallium-arsenide, and other such materials known to those skilled in the art. In addition, commercially available photovoltaic cells and materials may be used in the photovoltaic module 20.

A lid 10 is provided adjacent to the upper surface 5 of the photovoltaic cells 4 and has an appropriate shape and size to permit the lid 10 to cover and protect the photovoltaic cells 4 from possible damage. The lid 10 may have a surface shape complementary to the surface shape of the photovoltaic cells 4 so that the lid 10 conformally covers the photovoltaic cells 4. Desirably, the lid 10 is selected from materials that isolate the photovoltaic cells 4 from moisture and permit transmission of electromagnetic radiation in the wavelength band that is to be absorbed by the photovoltaic cells 4. For example, the lid 10 may comprise a low-lead tempered glass that allows sunlight to enter the module 20.

An optional backing layer 6 may be provided adjacent to the lower surface 7 of the photovoltaic cells 4 to provide structural support and/or protection for the photovoltaic cells. In addition, the backing layer 6 may be selected from electrically non-conductive materials, such as polyester, to electrically isolate the photovoltaic cells 4 from additional components of the photovoltaic module 20.

An encapsulating material 8 may be provided to encapsulate and protect the photovoltaic cells 4 and to bond the components of the photovoltaic module 20 together. For example, the encapsulating material 8 may be disposed between the photovoltaic cells 4 and the lid 10 to adhere the lid 10 to the photovoltaic cells 4. Likewise, the encapsulating material 8 may be disposed between the photovoltaic cells 4 and the backing layer 6 to adhere the backing layer 6 to the photovoltaic cells 4. The encapsulating material 8 disposed between the lid 10 and photovoltaic cells 4 should be optically transmissive to electromagnetic radiation in the wavelength band that is to be absorbed by the photovoltaic cells 4. In addition, the encapsulating material 6 should have chemical and heat resistant properties compatible with the environmental conditions under which the photovoltaic module 20 will be operated. Examples of such encapsulating materials include ethyl vinyl acetate (EVA) and UV-stabilized EVA. Such materials provide moisture protection to the photovoltaic cells, which is one of the desirable features of the encapsulating material 8. The encapsulating material 8 may also comprise a non-conductive material, in which case the optional backing layer 6 may be omitted.

The photovoltaic module 20 also includes a heat sink 2 comprised of a thermally conductive material, such as aluminum foil or an anodized aluminum foil, adjacent the optional backing layer 6. One advantage of using inherently optically reflective materials, such as aluminum foil, is that unabsorbed sunlight may be reflected back into the cells 4 by the heat sink 2, thereby increasing the power produced by the photovoltaic module 20. Optionally, the heat sink 2 may be coated with an optically reflective material. If the optional backing layer 6 is not used, the heat sink 2 is provided adjacent the encapsulating material 8. Since the heat sink 2 comprises a thermally conductive material, the electrically non-conductive feature of the backing layer 6 and/or encapsulating material 8 prevents undesired electrical communication between the photovoltaic cells 4 and the heat sink 2. The backing layer 6 and/or encapsulating material 8 may be provided in the form of a plurality of electrically insulating spacers disposed between the heat sink and the photovoltaic material. The heat sink 2 comprises a plurality of base segments 14 which provide a mounting surface for mounting the heat sink 2 to the backing layer 6. The heat sink 2 also comprises a plurality of fins 12 disposed between adjacent pairs of base segments 14. The fins 12 may be movable with respect to the base segments 14 due to the inherent flexibility of the fins 12 relative to the base segments 14. Alternatively, the fins 12 may be attached to the base segments 14 via mechanical means that permit movement between the fins 12 and the base segments 14. For example, the mechanical means may include a hinge structure, or other structures that permit movement therebetween.

Figure 2:
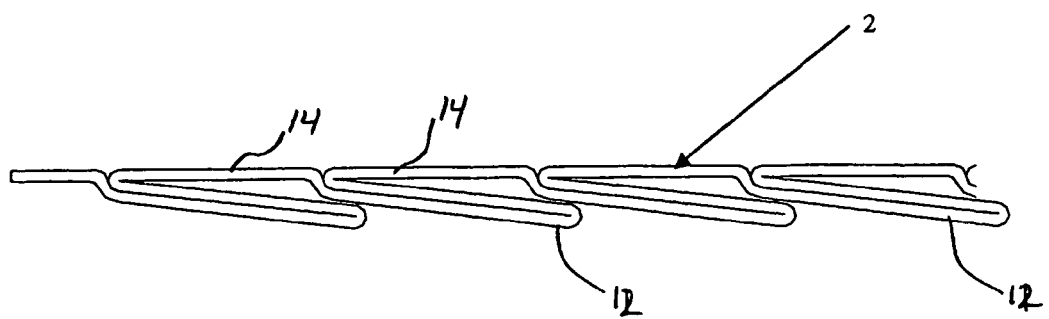
FIG. 2 is a side elevation view showing the structure of the heat sink depicted in FIG. 1.
Figure 3:
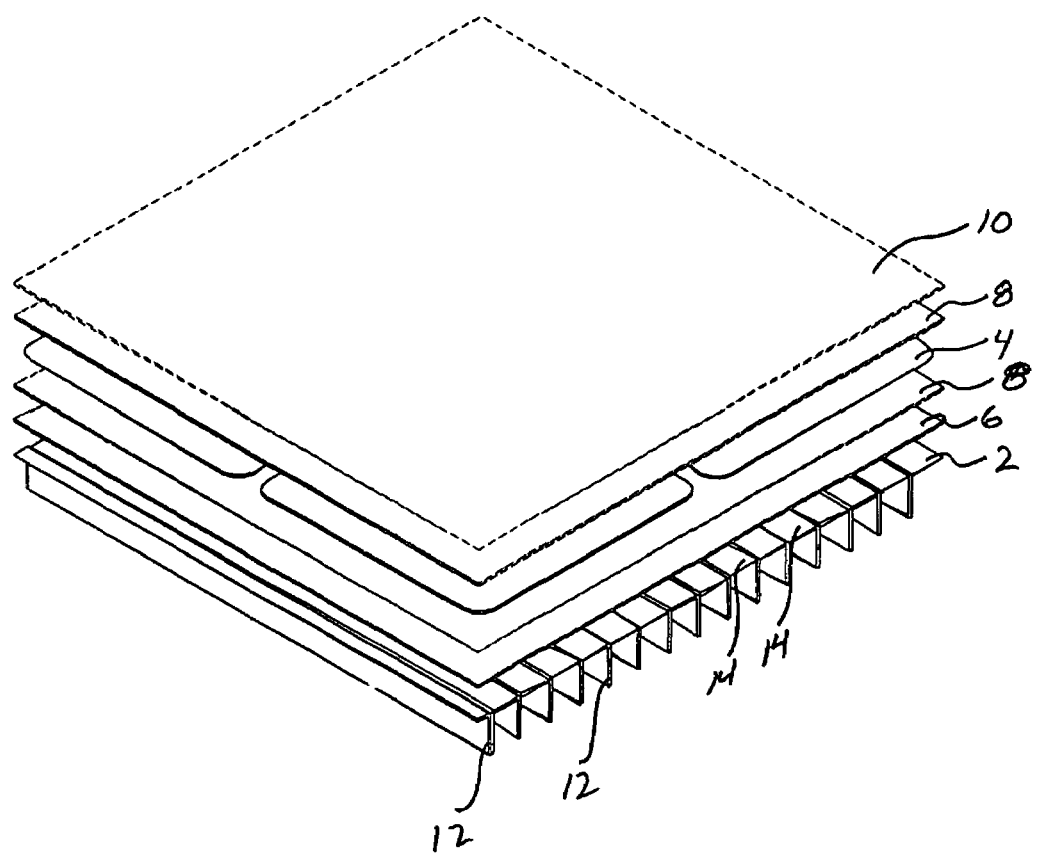
FIG. 3 is a exploded perspective view of the photovoltaic module of FIG. 1 with the heat sink fins disposed in a second, extended position.
Figure 4:
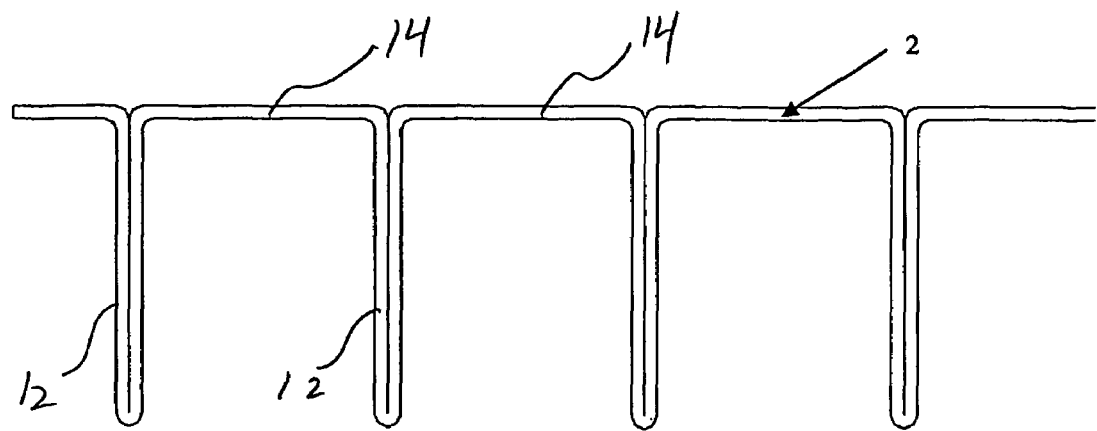
FIG. 4 is a side elevation view showing the structure of the heat sink depicted in FIG. 3.

FIGS. 1 and 2 illustrate a first configuration in which the fins 12 are located in a first flat position so that the fins 12 are substantially parallel to the plane containing the base segments 14. Such a configuration of the fins 12 in the first flat position provides a substantially flat heat sink 2, which is a particularly desirable configuration of the heat sink 2 prior to attachment to the backing layer 6 and/or encapsulating material 8. Such a flat configuration of the heat sink 2 is well suited to the lamination assembly process of the present invention, as well as lamination processes known to those skilled in the art. Once the heat sink 2 is attached to the backing layer 6 and/or encapsulating material 8, the fins 12 may be moved to a second extended position, substantially perpendicular to the base segments 14, as illustrated in FIGS. 3 and 4. Such a configuration of the fins 12 with respect to the base segments 14 is well suited to permit convective dissipation of heat from the heat sink 2 to the surrounding environment during use. Optionally, an area of the heat sink 2 may be provided without fins 12 to provide a region at which an electrical junction box may be provided.

During use, the module is oriented such that the outer surface of the lid 10 faces skyward and may be held at a specific angle to maximize its exposure to sunlight. When sunlight strikes the photovoltaic cells 4, some of the energy within the sunlight is converted to electrical energy and is removed via terminals or leads (not pictured). The sunlight that is not absorbed by the photovoltaic module 20 and not converted into electrical energy becomes heat energy and is transferred to the module's surroundings. The primary mode of heat transfer is convection to the ambient air from both the outer surface of the lid 10 and heat sink 2 of the module 20.

The spacing between the fins 12 as well as the height of the fins 12 can be optimized for a particular photovoltaic module's characteristics and heat load. As such, the fins 12 may be sufficiently short relative to the spacing between adjacent fins 12 so that the fins 12 do not overlap in the first flat position depicted in FIG. 1. In one desired configuration the heat sink 2 may be made of 76.2 μm thick aluminum film and having fins 12 with a height of 31.75 mm and a spacing between adjacent fins of 9.525 mm. Optionally, the fins 12 may have differing lengths. The fins 12 may also have holes or ridges stamped therein, in order to further facilitate convective heat transfer (not pictured), and may be coated with a high-emissivity coating in order to facilitate radiative heat transfer. In addition, the heat sink 2 may be manufactured from an appropriate material to make the extended fins 12 stiff enough to resist mild abrasion, thereby offering further protection to the cells 4.

Another advantage of this invention is the way in which the module can be laminated—with the heat sink as an integral part of the module—using, for example, standard laminating methods and techniques.

Typically, a photovoltaic module is constructed from several layers of materials that are sandwiched together under elevated temperatures. A vacuum is usually drawn as well. The materials are typically glass, EVA (ethyl-vinyl-acetate), solar cells, EVA, polyester, and Tedlar® brand polyvinyl fluoride, in that order. The last three layers are often purchased in one sheet of material called EPT (EVA-Polyester-Polyvinyl fluoride).

When manufacturing a photovoltaic module, the cells may be arranged and soldered together on a work surface, then lifted into the air by vacuum cups (while maintaining their spacing and alignment). A piece of glass is put under the cells, and then a layer of EVA is placed over the glass. The EVA is usually shipped to the factory in a roll, so a section is unrolled and cut to length. Next, the cells are lowered onto the EVA-glass "assembly" and a layer of EPT is unrolled, cut to length, and placed on top of the solar cells. This entire process is usually refereed to as "lay-up."

After assembly, the assembly may be placed in piece of equipment called a laminator. This device applies heat and pressure to the assembly for 10-15 minutes, for example, while also drawing a vacuum in the space of the laminate. The heat and pressure cure the EVA, which cross-links and bonds the entire laminate together. The vacuum is used to remove air trapped in between the layers during assembly.

An advantage of the heat sink of the present invention is that the heat sink is flexible enough to allow the fins to be folded flat so that they can be added as a layer in the lay-up and then laminated as part of the photovoltaic module in a standard laminator. For example, after the layer of EPT is placed on top of the solar cells, the heat sink of the present invention may be placed on top of the EPT with the fins folded flat on the outside of the stack. The cell-EVA-EPT-heat sink stack may then be placed in a laminator to bond the layers of the stack together. This allows for the heat sink to be added as an integral part of the module, and does not require a manufacturer to invest in new lay-up or lamination equipment. Subsequent to lamination, the fins of the heat sink may be unfolded into their operating position.

These and other advantages of the present invention will be apparent to those skilled in the art from the foregoing specification. Accordingly, it will be recognized by those skilled in the art that changes or modifications may be made to the above-described embodiments without departing from the broad inventive concepts of the invention. It should therefore be understood that this invention is not limited to the particular embodiments described herein, but is intended to include all changes and modifications that are within the scope and spirit of the invention as set forth in the claims.

What is claimed is:

1. A method for fabricating a photovoltaic module comprising the steps of:
    providing a photovoltaic material;
    providing a heat sink comprising a mounting surface and comprising a plurality of fins that are movable between a first position substantially parallel to the mounting surface and a second position substantially non-parallel to the mounting surface;
    orienting the fins substantially parallel to the mounting surface to permit the heat sink to be laminated to the photovoltaic material by a laminator; and
    laminating the heat sink to the photovoltaic material by applying heat and pressure while the fins are substantially parallel to the mounting surface to bond the heat sink to the photovoltaic material.

2. The method according to claim 1, comprising orienting the fins in the second position after the heat sink is attached to the photovoltaic material.

3. The method according to claim 1, wherein the step of laminating the heat sink comprises providing an electrically insulating material between the mounting surface of the heat sink and the photovoltaic material.

4. The method according to claim 3, wherein the step of laminating comprises laminating the heat sink, electrically insulating material, and photovoltaic material together.

5. The method according to claim 1, wherein the step of laminating comprises providing an encapsulating material between the mounting surface of the heat sink and the photovoltaic material.

6. The method according to claim 5, wherein the step of laminating comprises laminating the heat sink, encapsulating material, and photovoltaic material together.

7. The method according to claim 1, comprising attaching a lid over the photovoltaic material.

8. The method according to claim 7, comprising providing an encapsulating material between the lid and the photovoltaic material.

9. The method according to claim 1, wherein the step of providing a photovoltaic material comprises providing a photovoltaic cell.

10. The method according to claim 1, comprising providing at least one electrically insulating spacer between the heat sink and the photovoltaic material.

11. The method according to claim 1, wherein the heat sink comprises a sheet of thermally conductive polymer.

12. The method according to claim 1, wherein the heat sink comprises a metal foil.

13. The method according to claim 12, wherein the fins comprise folded portions of the metal foil.

14. The method according to claim 12, wherein the metal foil comprises anodized aluminum.

15. The method according to claim 1, comprising providing at least one hole in the fins.

16. The method according to claim 1, comprising providing a ridge on the fins.

17. The method according to claim 1, comprising providing a high-emissivity coating on the fins to facilitate radiative heat transfer.

18. The method according to claim 1, wherein the heat sink comprises an optically reflective material.

19. The method according to claim 18, comprising providing an optically reflective coating on the heat sink.

20. The method according to claim 1, wherein at least two of the fins have a different height.

21. A method for fabricating a photovoltaic module comprising the steps of:
    providing a photovoltaic material;
    providing a heat sink comprising a mounting surface and comprising a plurality of fins that are movable between a first position substantially parallel to the mounting surface and a second position substantially non-parallel to the mounting surface;
    orienting the fins substantially parallel to the mounting surface; and
    attaching the heat sink to the photovoltaic material, wherein the step of attaching the heat sink comprises laminating by applying heat and pressure.

* * * * *